US009118307B2

(12) United States Patent
Trautmann et al.

(10) Patent No.: US 9,118,307 B2
(45) Date of Patent: *Aug. 25, 2015

(54) METHOD FOR GENERATING PWM SIGNALS AND A PULSE WIDTH MODULATION POWER CONVERTER

(75) Inventors: Frank Trautmann, Munich (DE); Armin Stingl, Woerthsee (DE)

(73) Assignee: ZENTRUM MIKROELEKTRONIK DRESDEN AG, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/884,082

(22) PCT Filed: Nov. 9, 2011

(86) PCT No.: PCT/EP2011/069736
§ 371 (c)(1),
(2), (4) Date: Sep. 16, 2013

(87) PCT Pub. No.: WO2012/062802
PCT Pub. Date: May 18, 2012

(65) Prior Publication Data
US 2013/0342179 A1  Dec. 26, 2013

(30) Foreign Application Priority Data

Nov. 9, 2010  (EP) .................................... 10190437

(51) Int. Cl.
*H02M 1/08* (2006.01)
*H03K 3/017* (2006.01)
*H02M 3/158* (2006.01)
*H02M 3/335* (2006.01)
*H02M 1/00* (2007.01)

(52) U.S. Cl.
CPC ............... *H03K 3/017* (2013.01); *H02M 1/082* (2013.01); *H02M 3/158* (2013.01); *H02M 3/335* (2013.01); *H02M 2001/0019* (2013.01)

(58) Field of Classification Search
CPC ..... H02M 3/156; H02M 3/157; H02M 3/158; H02M 3/335; H02M 2001/0019
USPC .................................. 323/282, 283, 284, 285
See application file for complete search history.

(56) References Cited

U.S. PATENT DOCUMENTS 5,920,600 A * 7/1999 Yamaoka et al. ............. 375/376
7,038,438 B2 * 5/2006 Dwarakanath et al. ....... 323/283
7,570,037 B2 * 8/2009 Li et al. ......................... 323/283

(Continued)

FOREIGN PATENT DOCUMENTS

EP  1607562 A1  12/2005
EP  2202873 A1  6/2010

(Continued)

OTHER PUBLICATIONS

International Search Report for PCT/EP2011/069736 dated Sep. 7, 2012.

(Continued)

*Primary Examiner* — Jue Zhang
*Assistant Examiner* — Lakaisha Jackson
(74) *Attorney, Agent, or Firm* — Heslin Rothenberg Farley & Mesiti P.C.

(57) ABSTRACT

A method and an apparatus for generating PWM signals is provided. Upon detection of a load transient, a new PWM period is started if the load transient occurs during the off-time of a PWM signal and exceeds a specific magnitude.

7 Claims, 2 Drawing Sheets

(56) References Cited

U.S. PATENT DOCUMENTS

| | | |
|---|---|---|
| 8,471,544 B2 * | 6/2013 | Takahashi ............... 323/283 |
| 2002/0180410 A1 * | 12/2002 | Brooks ............... 323/282 |
| 2008/0252280 A1 * | 10/2008 | Prodic et al. ............... 323/283 |
| 2009/0237292 A1 | 9/2009 | Tigrek et al. |
| 2010/0001705 A1 * | 1/2010 | Takahashi ............... 323/283 |
| 2010/0102785 A1 | 4/2010 | Young |
| 2011/0121761 A1 * | 5/2011 | Zhao ............... 315/312 |
| 2011/0193648 A1 * | 8/2011 | Zhao ............... 332/109 |

FOREIGN PATENT DOCUMENTS

| | | |
|---|---|---|
| JP | 2010-017022 A | 1/2010 |
| TW | 528938 B | 4/2003 |

OTHER PUBLICATIONS

Office Action issued in corresponding Korean patent application No. 10-2013-7014871 dated Nov. 3, 2014.

* cited by examiner

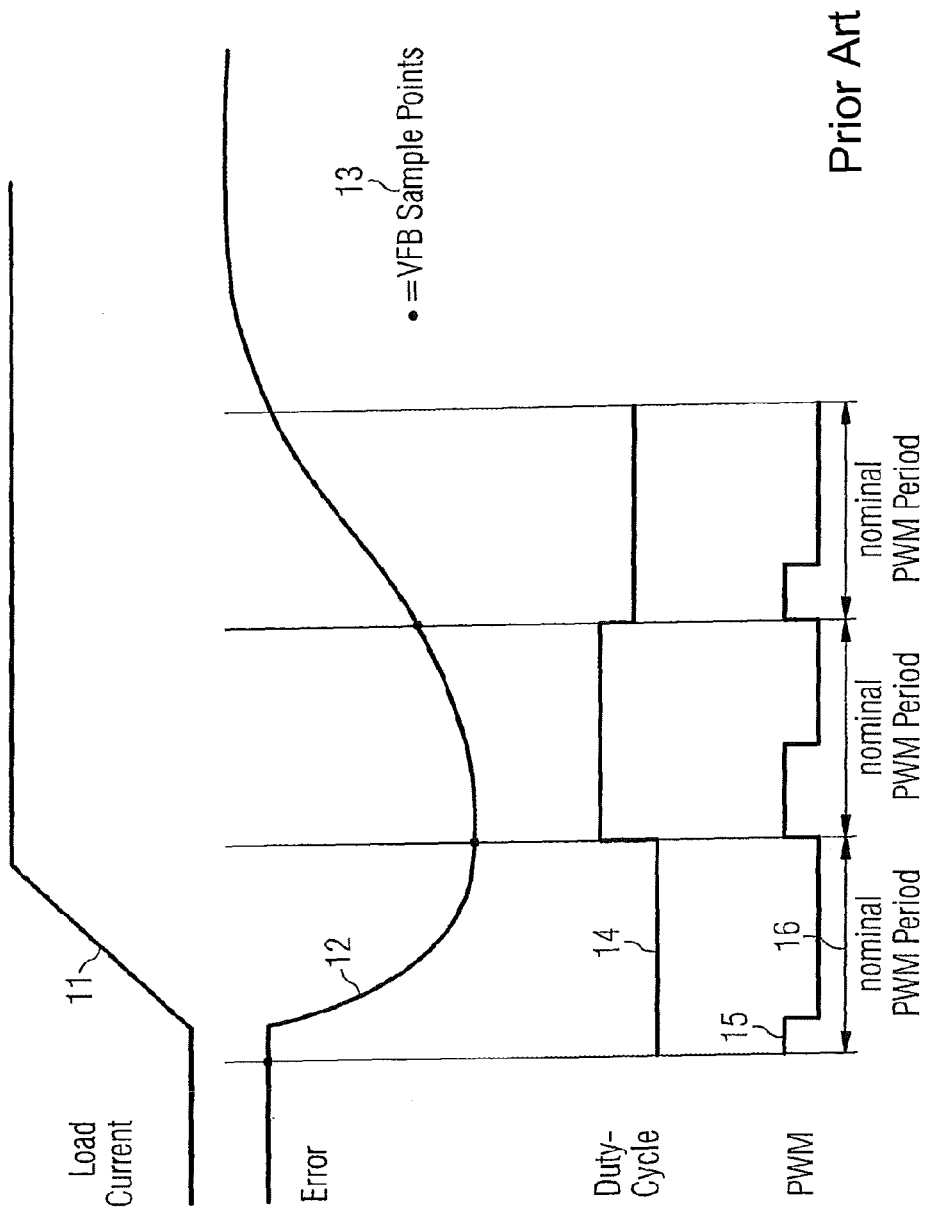

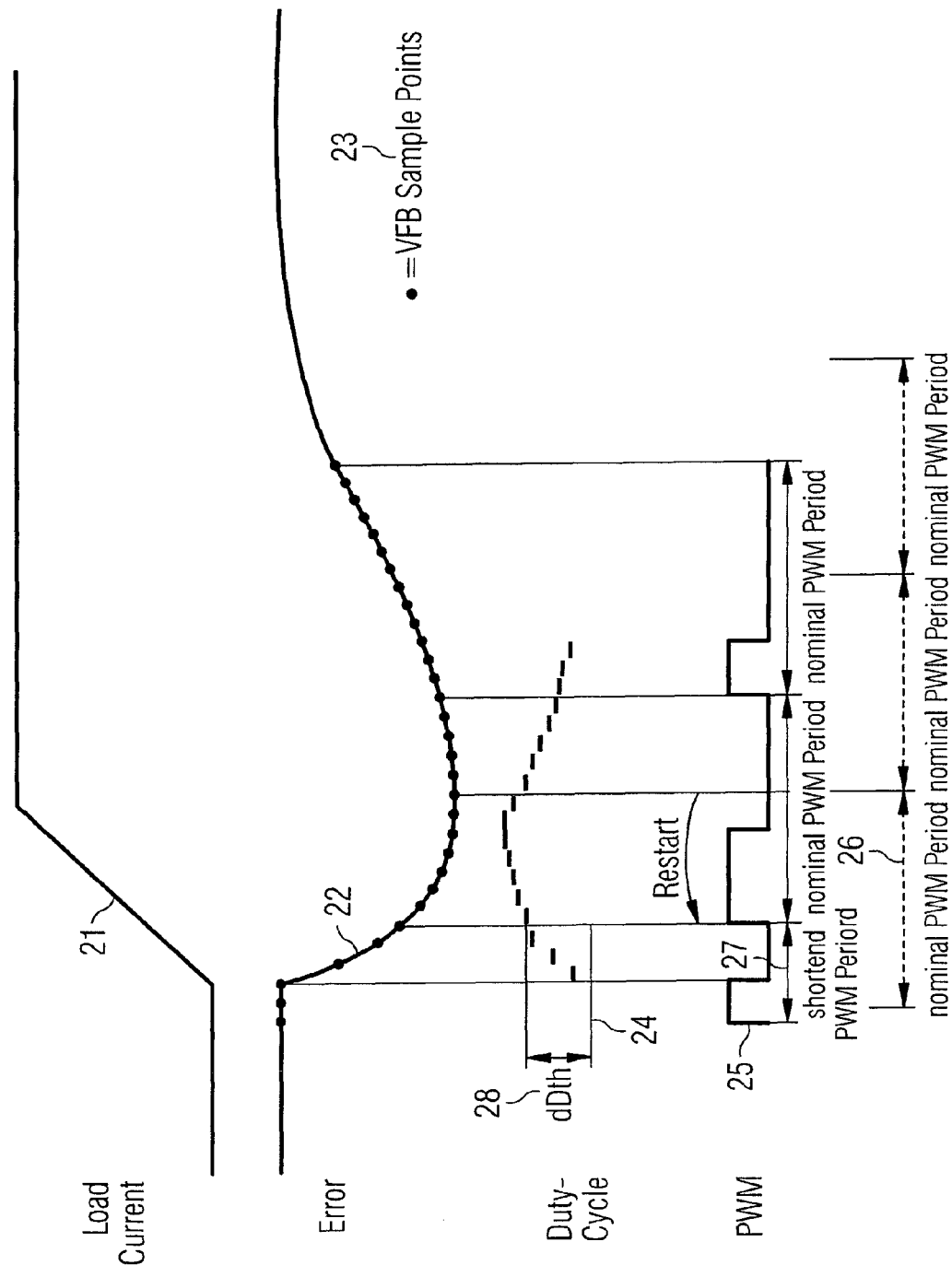
FIG 2: step response with pwm restart

METHOD FOR GENERATING PWM SIGNALS AND A PULSE WIDTH MODULATION POWER CONVERTER

CROSS REFERENCE TO RELATED APPLICATIONS

This application is a national stage filing under section 371 of International Application No. PCT/EP2011/069736 filed on Nov. 9, 2011, and published in English on May 18, 2012 as WO 2012/062802 A2 and claims priority of European patent application No. 10190437.3 filed on Nov. 9, 2010, the entire disclosure of these applications being hereby incorporated herein by reference.

TECHNICAL FIELD

The present invention relates to a method and apparatus for generating PWM signals having an improved positive load transient response. The present invention specifically relates to an apparatus and a method for generating PWM signals by means of oversampling with PWM restart in switching regulators or power converters.

BACKGROUND ART

A switching regulator is a circuit that uses a power switch, an inductor, and a diode to transfer energy from input to output. In contrast to linear regulators that use a resistive voltage drop to regulate the voltage and lose power in the form of heat, a switching regulator does not have a voltage drop and an associated current but instead the current is 90 degree out of phase with the voltage. Due to this, the energy is stored and can be recovered in the discharge phase of the switching cycle. In the art, several types of switching regulators exist dependent on how the switching circuit is arranged, for example step-down (buck), step-up (boost) or inverter (flyback). The switch can be controlled by a PWM signal with duty ratio D that represents the on state during a PWM period. The output voltage is dependent on the duty ratio D and, hence, can be controlled by a controller which consists of an analog-to-digital converter (ADC), a discrete-time control law, and a digital PWM (DPWM) module. The ADC samples and quantizes the regulated signal, i.e., the output voltage error that is the difference between the output voltage and an output voltage reference. The control law computes the digital duty ratio command D based on the quantized output voltage error. The control law is a given by a PID control law which is configured by a set of PID coefficients, the set comprising the proportional gain Kp, the integral gain Ki and the differential gain Kd and the time delay Td. The digital PWM modulator takes D as input, and outputs a PWM waveform with the commanded duty ratio D at a switching frequency. The PWM waveform has finite time resolution. The sensing and the quantization of other signals such as the load can be added depending on the application and the specific control law used.

In the state of the art, one error signal and one duty ratio is computed during one PWM period. In case a large load transient occurs, the response of the PID controller may be slow.

DISCLOSURE OF THE INVENTION

It is therefore an objective of the present invention to provide a method and an apparatus for generating PWM signals that lead to a superior response to load transients over the prior art.

The present invention relates to a control method for a power converter wherein an output voltage is generated according to a pulse width modulation signal and an input voltage. An error signal is generated by sampling the output voltage and differencing the sampled output voltage and an output voltage reference. A duty ratio that defines a duty cycle of pulse width modulation signal is determined by means of PID controlling algorithm generating a pulse width modulation signal by providing the duty ratio to a pulse width modulator. The duty ratio is monitored and compared to its predecessor by computing a duty ratio difference. The duty ratio is continuously monitored by computing and comparing a plurality of duty ratios within one PWM period. In case during an off-time of the pulse width modulation signal the duty ratio difference exceeds a threshold the pulse width modulator is triggered to start a new pulse width modulation period.

Preferably, the duty ratio is monitored in case a load transient is detected. The load transient may be detected by continuously monitoring the error signal.

The output voltage signal and/or the error signal may be oversampled by sampling a plurality of error signals within one PWM period. The oversampling is necessary for the load transient detection since a plurality of duty ratio are compared to its predecessors respectively within one PWM period.

Further, a moving average of the sampled error signal is computed by a moving average filter. This leads to an interpolated error signal with support in between the samples provided by the ADC. Moreover, by applying a moving average filter the ripple of the error signal is suppressed.

One aspect of the present invention relates to employing two different sets of PID coefficients. A first set of PID coefficients is selected in case a steady state is detected and a second set of PID coefficients is selected in case a load transient is detected. The switching between the two sets of coefficients in case of a change from steady state to load transient takes place before a restart of the PWM is triggered. A load transient leads to a quick rise of the duty ratio and in case the difference of two consecutive duty ratios exceeds a threshold a new PWM period is started.

A nonlinear gain KP may be selected in case of load transient detection. Adapted nonlinear gains KP have the advantage that a steady state is reached more quickly compared to linear gains.

One aspect of the present invention relates to a pulse width modulation power converter, comprising an output stage that generates an output voltage according to a pulse width modulation signal and an input voltage by means of a switching element. The PWM modulator further comprises means for providing an output voltage reference and an analog digital converter connected to the output stage and the means for providing an output voltage reference. The ADC samples and amplifies a difference between the output voltage and the output voltage reference to generate an error signal. A PID controller connected to the ADC and the switching element wherein the PID controller is configured by a set of PID coefficients determines a duty ratio for a pulse width modulator that generates the PWM signal. The pulse width modulation power converter further comprises means for monitoring the duty ratio. These means comprise means for comparing each value of the duty ratio to its predecessor by generating a duty ratio difference. In case the duty ratio difference exceeds a threshold during the off-time of the PWM signal the PWM modulator is triggered to start a new PWM period.

The pulse width modulation power converter may comprise means for detecting a load transient or a steady state, preferably means for monitoring the error signal.

One aspect of the present invention relates to oversampling. The pulse width modulation power converter comprises means for providing the analog-to-digital converter with a first clock frequency and the pulse width modulator with a second clock frequency, wherein the first clock frequency is higher than the second clock frequency.

One further aspect of the present invention relates to oversampling. The PWM power converter comprises a moving average filter for computing a moving average of the error.

Two different sets of PID coefficients may be provided to the PID controller, a first set for the steady state and a second set in case a load transient is detected. The two sets are stored in a memory and one of them is selected by selector means.

One further aspect of the present invention relates to the second set of PID coefficients for the transient mode. For the proportional gain Kp a plurality of nonlinear gain coefficients are provided in a storage means. A nonlinear gain coefficient is adaptively selected dependent on the load transient.

One further advantage of the present invention is that due to a superior response to load transients the size of the capacitors on a printed circuit board may be reduced.

BRIEF DESCRIPTION OF THE DRAWINGS

The apparatus and method according to the invention are described in more detail herein below by way of exemplary embodiments and with reference to the attached drawings, in which:
FIG. 1 shows a step response without PWM restart
FIG. 2 shows a step response with PWM restart

EMBODIMENT OF THE INVENTION

FIG. 1 shows a step response without PWM restart upon a load transient resulting from a positive change in a load current 11. The samples 13 of the error signal 12 are taken at the beginning of each nominal PWM period 16. The duty ratio 14 is also computed once per PWM period 16.

According to one embodiment of the present invention, FIG. 2 shows a step response with PWM restart. Here, the error signal 22 is oversampled. A plurality of samples 23 are taken in each nominal PWM period 26. The duty ratio 24 is computed for each sample within one nominal PWM period 26. Further the difference 28 between two consecutive duty ratios is computed and compared to a threshold. If that difference 28 exceeds the threshold during the off-time of the PWM signal 25, a new nominal PWM period 26 is started, thus leading to a shortened current PMW period 27.

While the present invention has been illustrated and described in detail in the drawings and foregoing description, such illustration and description are to be considered illustrative or exemplary and not restrictive. It will be understood that changes and modifications may be made by those of ordinary skill within the scope and spirit of the following claims

The invention claimed is:

1. A method for generating PWM signals, comprising:
generating an output voltage according to a pulse width modulation signal and an input voltage;
generating an error signal by sampling the output voltage and differencing the sampled output voltage and an output voltage reference;
determining a duty ratio that defines a duty cycle of a pulse width modulation signal by a PID controlling algorithm;
generating the pulse width modulation signal by providing the duty ratio to a pulse width modulator; and
continuously monitoring the duty ratio within one nominal PWM period by computing and comparing a plurality of consecutive duty ratios within said one nominal PWM period, said comparing comprising computing a duty ratio difference between the consecutive duty ratios, and in case the duty ratio difference exceeds a threshold during an off-time of the pulse width modulation signal, the pulse width modulator is triggered to start a new nominal pulse width modulation period earlier than a next scheduled PWM cycle.

2. The method according to claim 1 wherein the duty ratio is monitored in case a load transient is detected.

3. The method according to claim 2 wherein the load transient is detected by continuously monitoring the error signal.

4. The method according to claim 1, wherein the output voltage and/or the error signal is oversampled by sampling a plurality of error signals within the one nominal PWM period.

5. The method according to claim 1, wherein a moving average of the error signal is computed.

6. The method according to claim 1, wherein a first set of PID coefficients is selected in case a steady state is detected and a second set of PID coefficients is selected in case a load transient is detected.

7. The control method according to claim 6, wherein a nonlinear gain KP is selected in case of load transient detection.

\* \* \* \* \*